(12) United States Patent
Ding et al.

(10) Patent No.: US 7,471,736 B2
(45) Date of Patent: Dec. 30, 2008

(54) FREQUENCY BASED MODULATOR COMPENSATION

(75) Inventors: Lei Ding, Atlanta, GA (US); Walter Honcharenko, Monmouth Junction, NJ (US); Munawar Hussein Kermalli, Floral Park, NY (US); Zhengxiang Ma, Summit, NJ (US); Dennis Raymond Morgan, Morristown, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 732 days.

(21) Appl. No.: 10/673,223

(22) Filed: Sep. 30, 2003

(65) Prior Publication Data
US 2005/0069050 A1    Mar. 31, 2005

(51) Int. Cl.
*H04K 1/02* (2006.01)
(52) U.S. Cl. ............... 375/296; 375/141; 375/146; 375/295; 375/297
(58) Field of Classification Search ............. 375/141, 375/146, 295, 296
See application file for complete search history.

(56) References Cited

U.S. PATENT DOCUMENTS

| | | | |
|---|---|---|---|
| 5,642,382 A * | 6/1997 | Juan | 375/232 |
| 5,705,949 A * | 1/1998 | Alelyunas et al. | 329/304 |
| 5,923,712 A * | 7/1999 | Leyendecker et al. | 375/297 |
| 5,990,734 A * | 11/1999 | Wright et al. | 330/2 |
| 6,266,517 B1 * | 7/2001 | Fitzpatrick et al. | 455/114.3 |
| 6,687,311 B1 * | 2/2004 | Zhang | 375/298 |
| 6,956,954 B1 * | 10/2005 | Takemura et al. | 381/307 |
| 7,061,994 B2 * | 6/2006 | Li et al. | 375/316 |
| 7,158,578 B2 * | 1/2007 | Khlat | 375/261 |
| 2002/0037058 A1 * | 3/2002 | Birru | 375/340 |
| 2003/0072393 A1 * | 4/2003 | Gu | 375/322 |
| 2003/0141938 A1 * | 7/2003 | Poklemba et al. | 332/103 |

OTHER PUBLICATIONS

Faulkner, Michael. "Spectral Sensitivity of Power Amplifiers to Quadrature Modulator Misalignment." IEEE Transactions On Vehicular Technology, vol. 41, No. 4, Nov. 1992, pp. 516-525.

Cavers, James K. "The Effect of Quadrature Modulator and Demodulator Errors On Adaptive Digital Predistorters." IEEE 1996, pp. 1205-1209.

Runton, David et al. "Gauge the Impact of Modulator Performance On CDMA Performance." Wireless System Design, 10895566, Jul. 2000, vol. 5, Issue 7, pp. 1-4.

Faulkner, M. et al. "Automatic Adjustment of Quadrature Modulators." Electronics Letters, Jan. 31, 1991, vol. 27, No. 3, pp. 214-216.

Cavers, James K. "Adaptive Compensation for Imbalance and Offset Losses in Direct Conversion Transceivers." IEEE Transactions On Vehicular Technology., vol. 42, No. 4, Nov. 1993, pp. 581-588.

Cavers, James K. "New Methods for Adaptation of Quadrature Modulators and Demodulators in Amplifier Linearization Circuits." IEEE Transactions on Vehicular Technology, vol. 46, No. 3, Aug. 1997, pp. 707-716.

(Continued)

*Primary Examiner*—Chieh M Fan
*Assistant Examiner*—Siu M Lee (57) ABSTRACT

In a transmitter, an upconverter converts a lower frequency signal to a higher frequency signal. Prior to the upconversion, a compensator compensates for at least gain/phase distortion that will be introduced into the lower frequency signal by at least the upconverter.

17 Claims, 3 Drawing Sheets

OTHER PUBLICATIONS

Brandwood, D. H. "A complex gradient operator and its application in adaptive array theory." IEE Proc., vol. 130, Pts. 4 and H, No. 1, Feb. 1983, pp. 11-16.

Wright, Andrew et al. "Multi-Carrier WCDMA Basestation Design Considerations—Amplifier Linearization and Crest Factor Control." 2002 PMC-Sierra, Inc., Issue 1, Aug. 2002, pp. 1-34.

* cited by examiner

FREQUENCY BASED MODULATOR COMPENSATION

BACKGROUND OF THE INVENTION

Power amplifiers (PAs) are indispensable components in communication systems and are nonlinear in nature. At the PA output, the nonlinearity not only causes spectral regrowth, which interferes with adjacent channel signals, but also degrades the bit error rate of the inband signal. To compensate for the nonlinearity, PA linearization is often necessary.

Among the linearization techniques, digital baseband predistortion is highly cost effective. It adds a functional block, called a predistorter, before the digital-to-analog conversion and RF upconversion but after any other baseband processing. The predistorter ideally applies the exact inverse response of the power amplifier to a scaled version of the input signal. Therefore, the output of the predistorter-PA cascade is the input signal multiplied by a scaling factor. To construct such a predistorter, a feedback path is needed to capture the output of the PA.

The performance of baseband predistortion relies on accurate PA modeling and obtaining a precise inverse of the PA. In reality, however, the performance can also be affected significantly by imperfections in the upconverter in the transmitter and the downconverter in the feedback path. These imperfections are caused by the analog components employed in both the upconverter and the downconverter, such as mixers, filters, quadrature modulators, and quadrature demodulators.

To reduce these impairments in the downconverter, filters that have relatively flat frequency may be used, such as LC bandpass and lowpass filters, and digital demodulation, which is free of any demodulation errors. With these configurations and careful design, the imperfections in the downconverter can be negligible.

In the upconverter, there are two common configurations, but the analog impairments normally cannot be neglected in either. The first uses digital modulation and two-stage upconversion, i.e., first upconvert baseband signals to IF and then to RF. Because of the stringent image rejection requirements of the transmitter, a SAW filter is usually used in the IF stage for this configuration. But the SAW filter often has large frequency response variations, and therefore distorts the predistorted signal. The second choice for the upconverter is to use direct upconversion, in which the I/Q data streams are directly modulated to RF. This structure enables the upconverter to be easily reconfigured to generate RF signals in different frequency bands. It also uses fewer components and is easier to integrate. However, in practice, the quadrature carriers in the analog modulator do not have exactly the same amplitudes and an exact phase difference of 90 degrees. These effects are called gain/phase imbalance and cause cross-talk between the I and Q channels. In addition, leakage of the carriers to the transmitted signal manifests itself in the demodulated received signal as a dc offset. If uncompensated, the gain/phase imbalance and the dc offset would have a large effect on predistortion performance. Various techniques have been proposed in the past to compensate for these impairments. In these techniques, the gain/phase imbalance are assumed to be frequency independent. However, experiments performed by the inventors indicate that the gain/phase imbalance exhibits frequency dependent behavior when the signal bandwidth becomes wide, for example, 15 MHz.

SUMMARY OF THE INVENTION

The present invention provides a transmitter that includes an upconverter for converting a lower frequency signal to a higher frequency signal and a compensator that compensates for at least gain/phase distortion introduced into the lower frequency signal by at least the upconversion. The compensator may also compensate for dc offset introduced into the lower frequency signal.

In one exemplary embodiment, the upconverter is a direct upconverter that directly upconverts a baseband signal to the RF signal, and the baseband signal includes in-phase and quadrature phase components. The compensator includes filters compensating for gain/phase imbalance in the in-phase components and gain/phase imbalance in the quadrature phase components.

In another exemplary, the transmitter includes a compensator constructor that, based on a model of at least the direct upconverter including an in-phase channel, a quadrature phase channel, and cross coupling channels between the in-phase and quadrature phase channels, estimates the in-phase channel, the quadrature phase channel, and the cross coupling channels between the in-phase and quadrature phase channels. The compensator constructor constructs the filters in the compensator based on the estimated channels.

In another embodiment, at least one filter to correct for gain/phase distortion introduced by an upconverter is derived based on an inverse of the channel model for an upconverter. The inverse of the channel model for the upconverter is based on a cost function, which represents a mean square error, in the frequency domain, between a desired response of a system including at least the upconverter and an actual response of the system including at least the filter and the upconverter.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF THE EXEMPLARY EMBODIMENTS

Channel Models

Figure 1:
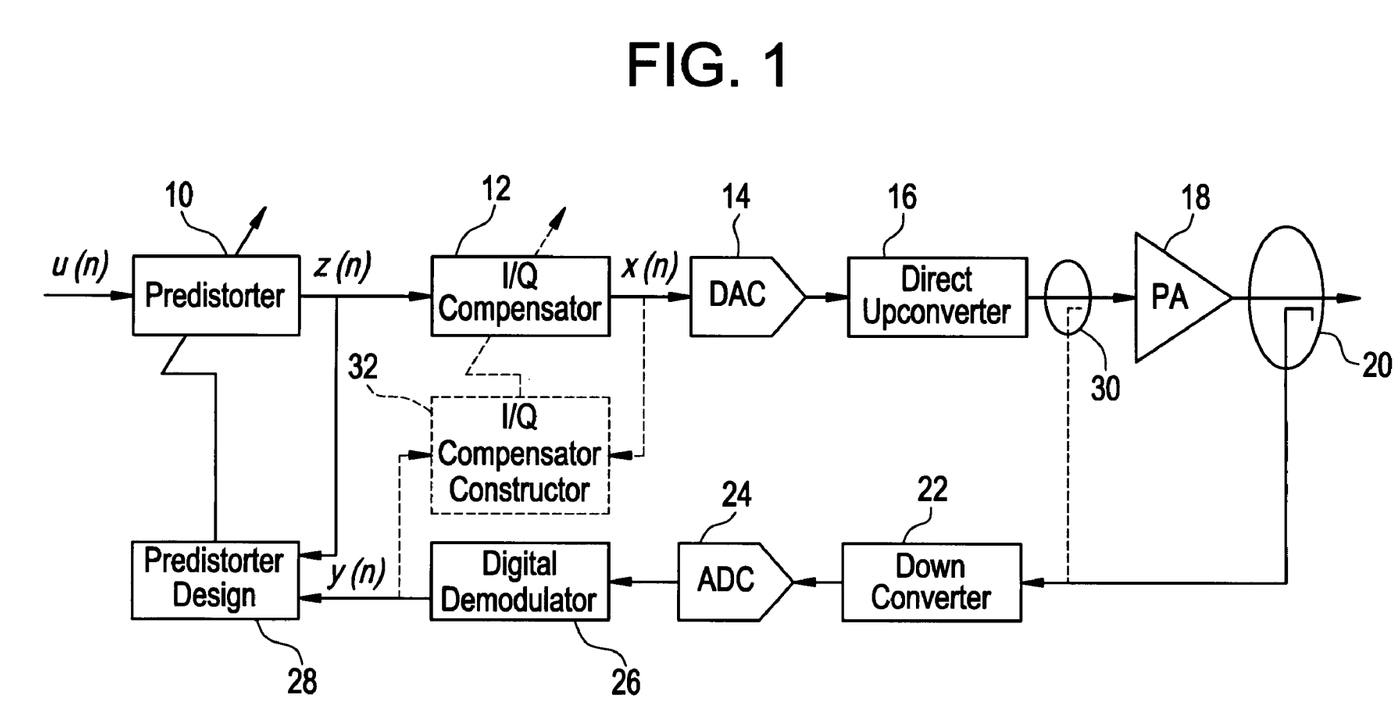
FIG. 1 illustrates the general structure of transmitter with a baseband predistortion system according to an embodiment of the present invention.

FIG. 1 illustrates the general structure of transmitter with a baseband predistortion system according to an embodiment of the present invention. As shown, a main signal path includes a predistorter 10, an I/Q compensator 12, a digital-to-analog converter (DAC) 14, a direct upconverter 16 and a power amplifier 18 connected in series. A coupler 20 couples the signal output from the power amplifier 18 to form a feedback path that includes a down converter 22, an analog-to-digital converter (ADC) 24, a digital demodulator 26 and a predistorter design unit 28. As shown in phantom lines, a secondary coupler 30 selectively delivers the output of the direct upconverter 16 to the down converter 22, and an I/Q compensator constructor 32 selectively configures the taps of the I/Q compensator 12. Except for the I/Q compensator 12, secondary coupler 30 and I/Q compensator construction unit 32, the other elements of the baseband predistortion system are well-known in the art. For the purposes of brevity, these elements will not be described in detail.

As discussed in the background section, the down converter 22 has a relatively flat frequency response and the digital demodulator 26 is free of demodulation errors. Accordingly, the feedback path causes no extra distortion except for additive white noise. In the main path (i.e., the transmitter path), direct upconversion has been adopted, which may be readily reconfigured to generate RF signals in different frequency bands, but introduces gain/phase imbalance and dc offset. The additional baseband processing for the input signal u(n) in the transmitter includes predistortion and I/Q compensation, whose outputs are denoted by z(n) and x(n), respectively.

During an initialization phase, the predistorter 10 and the I/Q compensator 12 are bypassed (i.e., x(n)=z(n)=u(n)) by having the I/Q compensator constructor 32 output a training signal to the DAC 14. The secondary coupler 30 sends the output of the direct upconverter 16 to the down converter 22, bypassing the PA 18, during this initialization phase. Based on x(n) and the output y(n) from the digital demodulator 26, the I/Q compensation constructor 32 estimates the parameters of a channel model as discussed in detail below and determines the taps of the filters forming the I/Q compensator 12 as discussed in detail below. After the initialization phase, the bypassed elements are inserted and the predistorter 10 is trained in the well-known manner.

As will be appreciated the initialization may be performed in many ways. For example, the predistorter 10 may be kept in the loop. Here, the secondary coupler 30 is not needed, as the output of the power amplifier 18 is received by the down converter 22 via the coupler 20. Based on the input to the predistorter 10 and the output y(n) from the digital demodulator 26, the I/Q compensation constructor 32 estimates the parameters of a channel model as discussed in detail below and determines the taps of the filters forming the I/Q compensator 12 as discussed in detail below.

During operation, the I/Q compensator constructor 32 may periodically or upon command re-estimate the received parameters using the compensation signal x(n) and the output of the digital demodulator y(n) and determine new taps of the filters forming the I/Q compensator 12. In this manner, the I/Q compensator 12 dynamically adapts to changes in the gain/phase imbalance and/or dc offset.

Next the method of modeling the channel creating the gain/phase imbalance and dc offset will be described in detail, followed by a description of estimating the parameters of the channel model. Lastly, determining the taps of the filters forming the I/Q compensator will be described. As part of the above-described aspects of the present invention, a detailed structure of the I/Q compensator according to one embodiment of the present invention will be provided.

Figure 2:
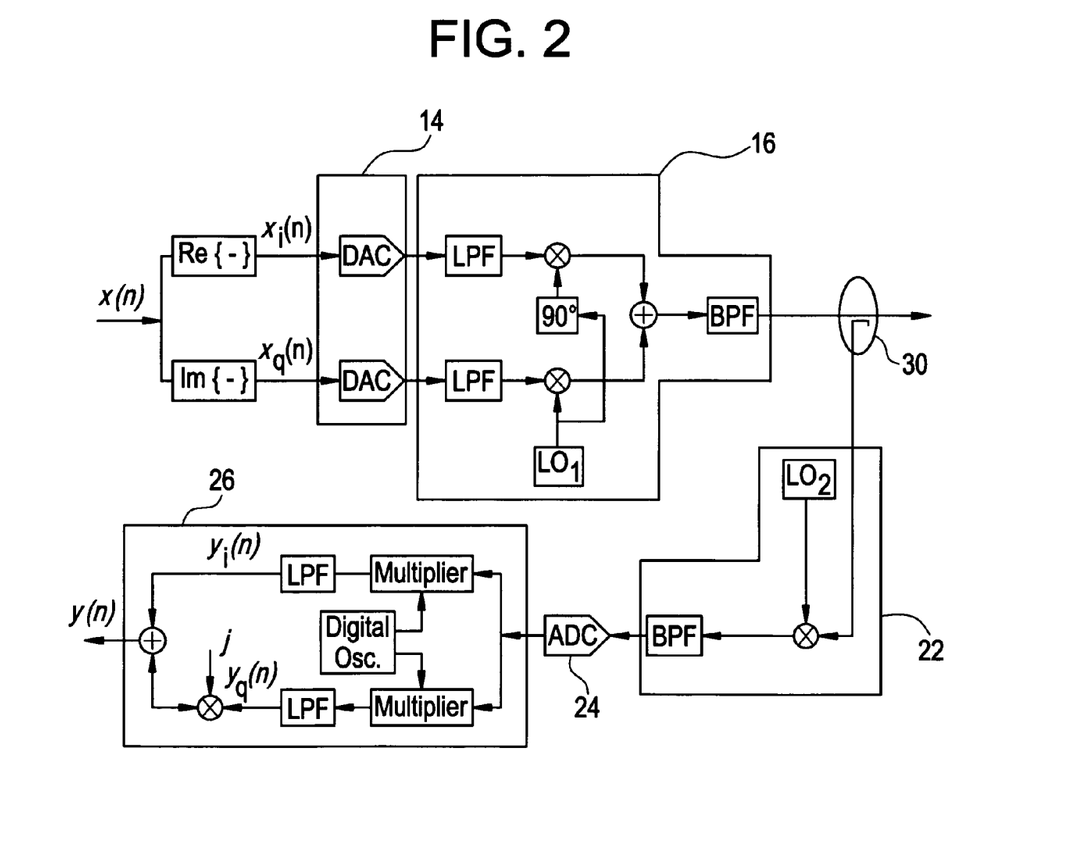
FIG. 2 illustrates a view of the channel path from x(n) to y(n) according to an embodiment of the present invention.

A detailed view of the channel from x(n) to y(n), is shown in FIG. 2, where Re{•} and Im{•} denote the real and imaginary parts of a complex number, respectively. We also use subscripts i (in-phase) and q (quadrature) to denote the real and imaginary parts of a complex sequence; for example, we have $$x(n)=x_i(n)+jx_q(n), y(n)=y_i(n)+jy_q(n).$$

Note that there may be a fixed delay and phase rotation (caused by the phase difference between the LOs) between x(n) and y(n), but they can be easily removed in any well-known manner.

Real I/Q Channel Model

The frequency dependent gain/phase imbalance affects the I and Q channels and the cross coupling between them. Moreover, the analog lowpass filters (LPF) and the mixers on the I and Q paths in FIG. 2 may not be exactly the same. To model the I and Q channels and the cross coupling channels between them, we use four real filters, $h_{11}$, $h_{12}$, $h_{21}$, and $h_{22}$, where $h_{11}$ and $h_{22}$ represent the I and Q channels, $h_{12}$ represents the cross coupling of the Q channel with the I channel, and $h_{21}$ represents the cross coupling of the I channel with the Q channel. The channel output y(n) then can be written as $$y(n) = \sum_{k=0}^{K-1} \{[x_i(n-k)h_{11}(k) + x_q(n-k)h_{12}(k)] + \quad (1)$$
$$j[x_q(n-k)h_{22}(k) + x_i(n-k)h_{21}(k)]\} +$$
$$d_i + w_i(n) + j[d_q + w_q(n)]$$

where $w_i(n)$ and $w_q(n)$ are, respectively, the real and imaginary parts of the complex white noise w(n) and $d_i$ and $d_q$ are, respectively, the real and imaginary parts of the dc offset d. In (1), we assume that all four filters have the same length K. This assumption simplifies the model and the derivations in the following sections although the same methodology can still be applied if the h filters have different lengths.

Complex I/Q Channel Model

In (1), we can combine the terms that have $x_i(n-k)$ or $x_q(n-k)$ and rewrite in a more compact form; i.e., $$y(n) = \sum_{k=0}^{K-1} [x_i(n-k)h_i(k) + x_q(n-k)h_q(k)] + d + w(n), \quad (2)$$

where $h_i(k)=h_{11}(k)+jh_{21}(k), h_q(k)=h_{12}(k)+jh_{22}(k).$

In other words, $h_{11}(k)=Re\{h_i(k)\}, h_{12}(k)=Re\{h_q(k)\},$ $h_{21}(k)=Im\{h_i(k)\}, h_{22}(k)=Im\{h_q(k)\}.$ Note that if there is no dc offset in the system and $h_q(k)=jh_i(k)$, y(n) can also be written as $$y(n) = \sum_{k=0}^{K-1} x(n-k)h(k) + w(n), \quad (3)$$

where $h(k)=h_i(k)=-jh_q(k)$. In this special case, the model in (2) is simplified to a single complex filter with coefficients h(k). This is the case when a digital IF (intermediate frequency) modulator (a form of upconverter that converts a baseband signal to an intermediate frequency signal) is used instead of a direct conversion modulator or an analog IF modulator. Here, the error introduced by the IF modulator and subsequent RF upconverter for converting the IF signal to an RF signal is more broadly thought of as gain/phase distortion, which in the case where $h(k)=h_i(k)=-jh_q(k)$ does not hold true includes gain/phase imbalance.

Direct/Image Channel Model

The complex I/Q model in (2) gives the relationship between the system output $y(n)$ and the real and imaginary parts of the system input $x(n)$. However, it is not clear from (2) how the channel affects the input $x(n)$ as a whole. We know that $$x_i(n) = \frac{x(n)+x^*(n)}{2}, \quad x_q(n) = \frac{x(n)+x^*(n)}{2j}, \tag{4}$$

where $(\bullet)^*$ denotes complex conjugate. Substituting (4) in (2), we obtain $$y(n) = \sum_{k=0}^{K-1} \left[ \frac{x(n-k)+x^*(n-k)}{2} h_i(k) + \frac{x(n-k)-x^*(n-k)}{2j} h_q(k) \right] + d + w(n). \tag{5}$$

Rearrange the r.h.s. of (5) to write $$y(n) = \sum_{k=0}^{K-1} [x(n-k)h_d(k) + x^*(n-k)h_m(k)] + d + w(n), \tag{6}$$

where $$h_d(k) = \frac{h_i(k)-jh_q(k)}{2}, \quad h_m(k) = \frac{h_i(k)+jh_q(k)}{2}, \tag{7}$$

are, respectively, the direct and image transfer function. Next we look at the relationship between $x(n)$ and $x^*(n)$. If $x(n)$ is a lower sideband signal, it can be expressed as the summation of a real sequence $x_d(n)$ and its Hilbert transform $\hat{x}_d(n)$, i.e., $$x(n)=x_d(n)+j\hat{x}_d(n). \tag{8}$$

Since $x_d(n)$ is a real sequence, it has a double sideband frequency spectrum $X_d(e^{j\omega})$. The spectrum of $x(n)$ is actually the lower sideband of $X_d(e^{j\omega})$ but with twice the amplitude. From (8), it follows that $x^*(n)=x_d(n)-j\hat{x}_d(n)$, whose spectrum is the upper sideband of $X_d(e^{j\omega})$ with twice the amplitude. Similarly, when $x(n)$ has an upper sideband spectrum, the spectrum of $x^*(n)$ is located at the lower sideband. For this reason, we call $x^*(n)$ the image of $x(n)$, $h_m(k)$ the image channel transfer function, and $h_d(k)$ the direct channel transfer function. In the channel model (6), we can see that if $h_i(k) \neq h_q(k)$, i.e., $h_m(k) \neq 0$, and the input $x(n)$ has one-sided spectrum, the image of $x(n)$ will show up in the other side of the spectrum, and its amplitude is determined by $h_m(k)$. When the input $x(n)$ has a double-sided spectrum, the images of lower and upper sidebands of $X(e^{j\omega})$ will also appear in the spectrum of the output; however, the images may be completely covered up by the spectrum of the original input signal in that case.

Note that the three models proposed are all equivalent models. However, they reveal different aspects of the channel, and each has their own pros and cons.

Least-Squares Method of Channel Estimation

For a block of N $x(n)$ and $y(n)$ data samples, (2) can be written in vector form; i.e., $$y=X_i h_i + X_q h_q + d1_P + w, \tag{9}$$

where $y=[y(K-L-1)y(K-L) \ldots y(N-L-1)]^T$ is a vector length $$P=N-K+1 \tag{10}$$

with L a selectable delay, $X_i=\text{Re}(X)$ and $X_q=\text{Im}(X)$ with $$X = \begin{bmatrix} x(K-1) & x(K-2) & x(K-3) & \cdots & x(0) \\ x(K) & x(K-1) & x(K-2) & \cdots & x(1) \\ \vdots & \vdots & \vdots & & \vdots \\ x(N-1) & x(N-2) & x(N-3) & \cdots & x(N-K) \end{bmatrix}, \tag{11}$$

$h_i=[h_i(0)h_i(1)\ldots h_i(k-1)]^T$, $h_q=[h_q(0)h_q(1)\ldots h_q(K-1)]^T$, $1_P$ is a column vector filled with all ones, and $w=[\omega(K-1)\omega(K)\ldots\omega(N-1)]^T$. Since K is the length of the model channel filter, we choose $$L=\lfloor(K-1)/2\rfloor, \tag{12}$$

where $\lfloor x \rfloor$ is the largest integer that is less than or equal to x, such that the maximum response in the model channel filter is located approximately at the center tap. Note that not all N samples of $y(n)$ are used in the formulation in order to avoid the boundary effect. The system output $y(n)$ is nominally matched with the input $x(n)$, i.e., the relative delay, amplitude, and phase difference between $y(n)$ and $x(n)$ have been removed.

To estimate the channel coefficients, we define a cost function as the mean square difference between the actual output y and the noiseless model output:

$$J=(y-X_i h_i - X_q h_q - d1_P)^H(y-X_i h_i - X_q h_q - d1_P), \tag{13}$$

where $(\bullet)^H$ denotes Hermitian transpose. The optimal $h_i$, $h_q$, and d that minimize the cost function can be found by setting the partial derivatives of J with respect to $h^*_i$, $h^*_q$, and $d^*$ to zero (assuming that $h_i$, $h_q$ and d are constants; i.e., $$\frac{\partial J}{\partial h_i^*} = X_i^H(y - X_i h_i - X_q h_q - d1_P) = 0 \tag{14}$$

$$\frac{\partial J}{\partial h_q^*} = X_q^H(y - X_i h_i - X_q h_q - d1_P) = 0 \tag{15}$$

$$\frac{\partial J}{\partial d^*} = 1_P^T(y - X_i h_i - X_q h_q - d1_P) = 0 \tag{16}$$

Since Xi and Xq in (14) and (15) are real matrices, the Hermitian transpose can be replaced with a transpose without conjugate. Rearranging (14)-(16) and putting them in a single equation, we have $$\begin{bmatrix} X_i^T X_i & X_i^T X_q & X_i^T 1_P \\ X_q^T X_i & X_q^T X_q & X_q^T 1_P \\ 1_P^T X_i & 1_P^T X_q & 1_P^T 1_P \end{bmatrix} \begin{bmatrix} h_i \\ h_q \\ d \end{bmatrix} = \begin{bmatrix} X_i^T y \\ X_q^T y \\ 1_P^T y \end{bmatrix}. \tag{17}$$

Therefore, the least-squares estimates of the $h_i$, $h_q$, and d are $$\begin{bmatrix} \hat{h}_i \\ \hat{h}_q \\ \hat{d} \end{bmatrix} = \begin{bmatrix} X_i^T X_i & X_i^T X_q & X_i^T 1_P \\ X_q^T X_i & X_q^T X_q & X_q^T 1_P \\ 1_P^T X_i & 1_P^T X_q & 1_P^T 1_P \end{bmatrix}^{-1} \begin{bmatrix} X_i^T y \\ X_q^T y \\ 1_P^T y \end{bmatrix} \quad (18)$$

Note that a coarse estimate of the dc offset can be obtained as the difference between the mean of the system output and that of the system input; i.e., $$\hat{d} = \frac{1}{N} \sum_{n=0}^{N-1} [y(n) - x(n)]. \quad (19)$$

where N is the window of samples over which the dc offset is determined. From the complex I/Q model, we know that d is given by $$d = d_y - \left[ \text{Re}\{d_x\} \sum_{k=0}^{K-1} h_i(k) + \text{Im}\{d_x\} \sum_{k=0}^{K-1} h_q(k) \right], \quad (20)$$

where $d_x$ and $d_y$ are, respectively, the mean values of the input x(n) and the output y(n). Therefore, in order for (19) to be accurate, either $d_x$ needs to be very small or $$\sum_{k=0}^{K-1} h_i(k) \approx 1$$

and $$\sum_{k=0}^{K-1} h_q(k) \approx j.$$

If either of these conditions hold, then we may use (19) to estimate the dc offset and adjust the cost function (13) to $$J = (y - \hat{d}1_P - X_i h_i - X_q h_q)^H (y - \hat{d}1_P - X_i h_i - X_q h_q), \quad (21)$$

Similar to the previous derivation of the least-squares solutions, the least-squares estimates of the $h_i$, $h_q$ are then given by $$\begin{bmatrix} \hat{h}_i \\ \hat{h}_q \end{bmatrix} = \begin{bmatrix} X_i^T X_i & X_i^T X_q \\ X_q^T X_i & X_q^T X_q \end{bmatrix}^{-1} \begin{bmatrix} X_i^T (y - \hat{d}1_P) \\ X_q^T (y - \hat{d}1_P) \end{bmatrix} \quad (22)$$

Least-Squares Method with Diagonal Loading

Since the input signal x(n) is usually a bandpass signal, the channel estimates are only accurate within the band. The out-of-band responses are solely determined by the wideband noise in y(n). These arbitrary out-of-band responses are not desired in predistortion applications, where the low level out-of-band signal needs to be accurately preserved in order to compensate for the PA nonlinearity. A simple solution is to add an artificial white noise to both x(n) and y(n) to create a flat frequency response over the whole band. The artificial noise level may be controlled to be well above the original white noise level in y(n) but well below the inband signal level. Thus, an artificial flat out-of-band response is created that preserves the inband channel response. Let us denote the artificial white noise as v(n), whose real and imaginary parts are, respectively, $v_i(n)$ and $v_q(n)$. Similar to the definition of $X_i$, and $X_q$, we can define $V_i$ and $V_q$ and rewrite (18) for the case where v(n) is added to both x(n) and y(n), which leads to $$\begin{bmatrix} \hat{h}_i \\ \hat{h}_q \\ \hat{d} \end{bmatrix} = \quad (23)$$

$$\begin{bmatrix} (X_i + V_i)^T (X_i + V_i) & (X_i + V_i)^T (X_q + V_q) & (X_i + V_i)^T 1_P \\ (X_q + V_q)^T (X_i + V_i) & (X_q + V_q)^T (X_q + V_q) & (X_q + V_q)^T 1_P \\ 1_P^T (X_i + V_i) & 1_P^T (X_q + V_q) & 1_P^T 1_P \end{bmatrix}^{-1} \times$$

$$\begin{bmatrix} (X_i + V_i)^T (y + v) \\ (X_q + V_q)^T (y + v) \\ 1_P^T (y + v) \end{bmatrix},$$

where $v = [v(K-1) v(K) \ldots v(N-1)]^T$. Ideally, $v_i(n)$ and $v_q(n)$ are uncorrelated with each other and are uncorrelated with x(n) and y(n). Moreover, the mean value of v(n) is zero. Therefore, instead of calculating (23), we may estimate the channel parameters using the following formula $$\begin{bmatrix} \hat{h}_i \\ \hat{h}_q \\ \hat{d} \end{bmatrix} = \begin{bmatrix} X_i^T X_i + \sigma^2 I & X_i^T X_q & X_i^T 1_P \\ X_q^T X_i & X_q^T X_q + \sigma^2 I & X_q^T 1_P \\ 1_P^T X_i & 1_P^T X_q & 1_P^T 1_P \end{bmatrix}^{-1} \begin{bmatrix} X_i^T y + \sigma^2 e \\ X_q^T y + \sigma^2 e \\ 1_P^T y \end{bmatrix}, \quad (24)$$

where $\sigma^2$ is the variance of the artificial noise, I is a K×K identity matrix, and $e = [0_L^T 1 \; 0_L^T]^T$, where $0_L$ and $0_M$ are, respectively, length $L = \lfloor (K-1)/2 \rfloor$ and $M = K - L - 1$ column vectors filled with all zeros. In the case where the dc offset is estimated using (19), the least-squares estimates of the $h_i$, $h_q$ with diagonal loading reduce to $$\begin{bmatrix} \hat{h}_i \\ \hat{h}_q \end{bmatrix} = \begin{bmatrix} X_i^T X_i + \sigma^2 I & X_i^T X_q \\ X_q^T X_i & X_q^T X_q + \sigma^2 I \end{bmatrix}^{-1} \begin{bmatrix} X_i^T (y - \hat{d}1_P) + \sigma^2 e \\ X_q^T (y - \hat{d}1_P) + \sigma^2 e \end{bmatrix} \quad (25)$$

In either case, the diagonal loading has the additional advantage of regularizing the solution, i.e., reducing the condition number of the correlation matrix, so that more accurate solutions can be achieved.

As will be appreciated from the above description, the I/Q compensator constructor 32 estimates the dc offset from the signals x(n) and y(n) using equation (19) and estimates the response of the I or in-phase channel $\hat{h}_i$ and the response of the Q or quadrature phase channel $\hat{h}_q$ from the signals x(n) and y(n) using either equation (22) or equation (25).

Construction of the I/Q Compensator

Figure 3:
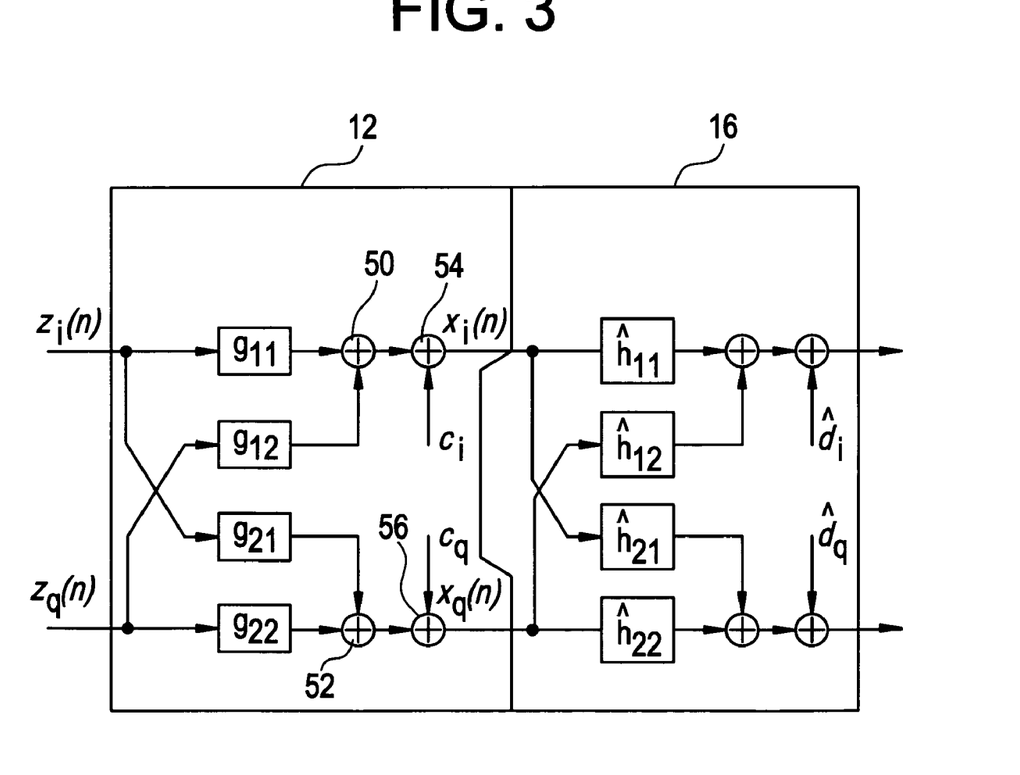
FIG. 3 illustrates a block diagram of the cascade of I/Q compensator and the upconverter according to an embodiment of the present invention.

After obtaining the channel filter estimates $\hat{h}_i$ and $\hat{h}_q$ and the dc offset estimate $\hat{d}$, the I/Q compensator 12 is constructed by the I/Q compensator constructor 32 to compensate for these imperfections. It turns out that these imperfections can be fully compensated by an I/Q compensator that has structure similar to the channel models described above. To ease the derivation, one exemplary embodiment uses the real I/Q channel model to represent both the I/Q compensator 12 and the baseband direct upconverter 16. A block diagram of the cascade of the I/Q compensator 12 and the upconverter 16 is shown in FIG. 3. As shown, the I/Q compensator 12 includes four real finite impulse response (FIR) filters, $g_{11}$, $g_{12}$, $g_{21}$, $g_{22}$. The first filter $g_{11}$ filters the in-phase components and the second filter $g_{12}$ filters the quadrature phase components. A first adder 50 adds the outputs of the first and second filters $g_{11}$ and $g_{12}$ to produce a gain/phase compensated in-phase signal. The third filter $g_{21}$ filters the in-phase components and the fourth filter $g_{22}$ filters the quadrature phase components. A second adder 52 adds the outputs of the third and fourth filters $g_{21}$ and $g_{22}$ to produce a gain/phase compensated quadrature phase signal. A third adder 54 adds an in-phase dc component $c_i$ to the in-phase signal and a fourth adder 56 adds a quadrature phase dc component $c_q$ to the quadrature phase signal to compensate for dc offset.

Offset Compensation

Let us first consider the compensation of the dc offset $\tilde{d}$ using the dc component ($c_i$, $c_q$) in the I/Q compensator 12. After passing through the four channel filters $g_{11}$, $g_{12}$, $g_{21}$, and $g_{22}$, the dc component c becomes $$\tilde{c}_i = c_i s_{11} + c_q s_{12},$$

$$\tilde{c}_i = c_i s_{21} + c_q s_{22} \quad (26)$$

where $$s_{11} = \sum_{k=0}^{K-1} \hat{h}_{11}(k), \quad s_{12} = \sum_{k=0}^{K-1} \hat{h}_{12}(k)$$

$$s_{21} = \sum_{k=0}^{K-1} \hat{h}_{21}(k), \quad s_{22} = \sum_{k=0}^{K-1} \hat{h}_{22}(k). \quad (27)$$

Thus, adding c in the I/Q compensation 12 is equivalent of adding a dc component $\tilde{c}$ at the end of the cascade. In order to compensate for the dc offset $\tilde{d}$, we would like to have $\tilde{c}_i = -\tilde{d}_i$ and $\tilde{c}_q = -\tilde{d}_q$; i.e., $$c_i s_{11} + c_q s_{12} = -\tilde{d}_i.$$

$$c_i s_{21} + c_q s_{12} = -\tilde{d}_q \quad (28)$$

It is clear from (28) that the solution for $c_i$ and $c_q$ is $$\begin{bmatrix} c_i \\ c_q \end{bmatrix} = \begin{bmatrix} s_{11} & s_{12} \\ s_{21} & s_{22} \end{bmatrix}^{-1} \begin{bmatrix} -\hat{d}_i \\ -\hat{d}_q \end{bmatrix}. \quad (29)$$

Note that when the inverse matrix in (29) is close to the identity matrix, we have $$\begin{bmatrix} c_i \\ c_q \end{bmatrix} \approx \begin{bmatrix} -\hat{d}_i \\ -\hat{d}_q \end{bmatrix}. \quad (30)$$

Accordingly, the I/Q compensator constructor 32 sets the dc offset compensation $c_i$, $c_q$ according to equation (29) or (30).

Gain/Phase Imbalance Compensation

Next we consider the problem of designing the four filters $g_{11}$, $g_{12}$, $g_{21}$, and $g_{22}$ in the I/Q compensator 12. We adopt a frequency domain approach to solve this problem. Denote the Fourier transform of $y_i(n)$ and $y_q(n)$ by $Y_i(e^{j\omega})$ and $Y_q(e^{j\omega})$, respectively, and the Fourier transform of $z_i(n)$ and $z_q(n)$ by $Z_i(e^{j\omega})$ and $Z_q(e^{j\omega})$, respectively. The outputs $Y_i(e^{j\omega})$ and $Y_q(e^{j\omega})$ of the digital demodulator 26 can be expressed as $$\begin{bmatrix} Y_i(e^{j\omega}) \\ Y_q(e^{j\omega}) \end{bmatrix} = \begin{bmatrix} \hat{H}_{11}(e^{j\omega}) & \hat{H}_{12}(e^{j\omega}) \\ \hat{H}_{21}(e^{j\omega}) & \hat{H}_{22}(e^{j\omega}) \end{bmatrix} \begin{bmatrix} G_{11}(e^{j\omega}) & G_{12}(e^{j\omega}) \\ G_{21}(e^{j\omega}) & G_{22}(e^{j\omega}) \end{bmatrix} \begin{bmatrix} Z_i(e^{j\omega}) \\ Z_q(e^{j\omega}) \end{bmatrix}. \quad (31)$$

To make $Y_i(e^{j\omega}) = Z_i(e^{j\omega})$ and $Y_q(e^{j\omega}) = Z_q(e^{j\omega})$, we need $$\begin{bmatrix} G_{11}(e^{j\omega}) & G_{12}(e^{j\omega}) \\ G_{21}(e^{j\omega}) & \hat{G}_{22}(e^{j\omega}) \end{bmatrix} = \quad (32)$$

$$\begin{bmatrix} \hat{H}_{11}(e^{j\omega}) & \hat{H}_{12}(e^{j\omega}) \\ \hat{H}_{21}(e^{j\omega}) & \hat{H}_{22}(e^{j\omega}) \end{bmatrix}^{-1} = A(e^{j\omega}) \begin{bmatrix} \hat{H}_{22}(e^{j\omega}) & -\hat{H}_{12}(e^{j\omega}) \\ -\hat{H}_{21}(e^{j\omega}) & \hat{H}_{11}(e^{j\omega}) \end{bmatrix},$$

where $$A(e^{j\omega}) = \frac{1}{[\hat{H}_{11}(e^{j\omega})\hat{H}_{22}(e^{j\omega}) - \hat{H}_{12}(e^{j\omega})\hat{H}_{21}(e^{j\omega})]}. \quad (33)$$

In the time domain, we may view (32) as follows, $$g_{11}(k) = \hat{h}_{22}(k) * a(k), \; g_{12}(k) = -\hat{h}_{12}(k) * a(k)$$

$$g_{21}(k) = -\hat{h}_{21}(k) * a(k), \; g_{22}(k) = \hat{h}_{11}(k) * a(k) \quad (34)$$

where * denotes convolution and a(k) is the inverse Fourier transform of $A(e^{j\omega})$. From the definition of $A(e^{j\omega})$, a(k) is the inverse of filter $$h_c(k) = \hat{h}_{11}(k) * \hat{h}_{22}(k) - \hat{h}_{12}(k) * \hat{h}_{21}(k); \quad (35)$$

i.e., the convolved response of filters a(k) and $h_c(k)$, denoted by c(k), approximates a delta function with a certain delay. In other words, we would like the Fourier transform of c(k) to be close to a desired frequency response $e^{-j\omega n_0}$, where $n_0$ is the desired delay. To find the optimal a(k) coefficients, we suppose that filter a(k) has $K_a$ taps, the convolved response of a(k) and $h_c(k)$ can be written as $$c(k) = \sum_{l=0}^{K_a-1} h_c(k-l) a(l), \; k = 0, 1, \ldots, K_a + 2K - 3, \quad (36)$$

which has length $K_c = K_a + 2K - 2$. [Note that filter $h_c(k)$ is of length $2K-1$]. We then define a cost function as the integrated difference between the frequency response of filter c(k) and the desired frequency response within given passband $[-\omega_p, \omega_p]$; i.e., $$J_c = \quad (37)$$

$$\int_{-\omega_p}^{\omega_p} \left[ \sum_{k_1=0}^{K_c-1} c(k_1) e^{-j\omega k_1} - e^{-j\omega n_0} \right] \left[ \sum_{k_2=0}^{K_c-1} c(k_2) e^{-j\omega k_2} - e^{-j\omega n_0} \right]^* d\omega.$$

Substituting (36) into (37), we have $$J_c = \int_{-\omega_P}^{\omega_P} \left[ \sum_{k_1=0}^{K_c-1} \sum_{l_1=0}^{K_a-1} h_c(k_1-l_1)a(l_1)e^{-j\omega k_1} - e^{-j\omega n_0} \right] \times \\ \left[ \sum_{k_2=0}^{K_c-1} \sum_{l_2=0}^{K_a-1} h_c(k_2-l_2)a(l_2)e^{-j\omega k_2} - e^{-j\omega n_0} \right]^* d\omega. \quad (38)$$

To find the optimal a(k) that minimizes the cost function, we take the partial derivative of $J_c$ in (38) with respect to a*(l) (assuming a(l) is constant and set it to zero); i.e., $$\frac{\partial J_v}{\partial a^*(l)} = \int_{-\omega_P}^{\omega_P} \left[ \sum_{k_1=0}^{K_c-1} \sum_{l_1=0}^{K_a-1} h_c(k_1-l_1)a(l_1)e^{-j\omega k_1} - e^{-j\omega n_0} \right] \times \\ \sum_{k_2=0}^{K_c-1} h_c^*(k_2-l)e^{j\omega k_2} d\omega = 0; \quad l=0,\ldots,K_a-1. \quad (39)$$

Rearrange (39) to write $$\frac{\partial J_c}{\partial a^*(l)} = \quad (40)$$

$$\sum_{l_1=0}^{K_a-1} a(l_1) \sum_{k_1=0}^{K_c-1} \sum_{k_2=0}^{K_c-1} h_c(k_1-l_1)h_c^*(k_2-l) \int_{-\omega_P}^{\omega_P} e^{-j\omega(k_1-k_2)} d\omega - \\ \sum_{k_2=0}^{K_c-1} h_c^*(k_2-l) \int_{-\omega_P}^{\omega_P} e^{-j\omega(n_0-k_2)} d\omega = 0.$$

In predistortion applications, the least-squares with diagonal loading is used for estimating the four h filters, and filters $h_{11}(k)$ and $h_{22}(k)$ have flat responses outside of the signal band. Moreover, the responses of the cross coupling filters $h_{12}(k)$ are usually much smaller than those of the filters $h_{11}(k)$ and $h_{22}(k)$. Therefore, the out-of-band response of filter $h_c(k)$ may be considered as flat with unit gain. Thus, we can us $\omega_p=\pi$ in (40). In the channel estimation phase, we want the maximum amplitudes of the filters to occur around the center taps. When we construct the inverse filters here, we also let our desired response for filter c(n) be a delta function around the center tap; i.e., $n_0=(K_c-1)/2$. Substituting $\omega_p=\pi$ $n_0=(K_c-1)/2$ into (40) and carrying out the integration, we obtain $$\frac{\partial J_c}{\partial a^*(l)} = \sum_{l_1=0}^{K_a-1} a(l_1) \sum_{k_1=0}^{K_c-1} \sum_{k_2=0}^{K_c-1} h_c(k_1-l_1)h_c^*(k_2-l)2\pi \operatorname{sinc}(k_1-k_2) - \\ \sum_{k_2=0}^{K_c-1} h_c^*(k_2-l)2\pi \operatorname{sinc}(n_0-k_2) = 0, \quad (41)$$

where $$\operatorname{sinc}(x) = \frac{\sin(\pi x)}{\pi x}. \quad (42)$$

For l from 0 to $K_a-1$, we have a set of equations from (41); i.e., $$\sum_{l_1=0}^{K_a-1} a(l_1) \sum_{k_1=0}^{K_c-1} \sum_{k_2=0}^{K_c-1} 2\pi h_c(k_1-l_1)h_c^*(k_2-l_2) \operatorname{sinc}(k_1-k_2) = \\ \sum_{k_2=0}^{K_c-1} 2\pi h_c^*(k_2-l) \operatorname{sinc}(k_1-k_2). \quad (43)$$

Removing $2\pi$ from both sides of (43) and rewriting it in matrix form, we have $$R_h a = h_a \quad (44)$$

where $a=[a_0 \ldots a_{K_a-1}]^T$, and the elements of matrix $R_h$ and column vector $h_a$ are defined as $$R_h(l_1, l) = \sum_{k_1=0}^{K_c-1} \sum_{k_2=0}^{K_c-1} h_c(k_1-l_1)h_c^*(k_2-l)\operatorname{sinc}(k_1-k_2) \quad (45)$$

$$h_a(l) = \sum_{k_2=0}^{K_c-1} h_c^*(k_2-l)\operatorname{sinc}(n_0-k_2). \quad (46)$$

Note that $R_h$ is a Toeplitz matrix, so we only need to calculate the first row and column of the matrix. The least-squares estimate of a from (44) is $$\hat{a} = R_h^{-1} h_a. \quad (47)$$

Accordingly, the I/Q compensator constructor 32 determines $\hat{a}$ according to equation (47) and then determines the filter taps for filters $g_{11}$, $g_{12}$, $g_{21}$, and $g_{22}$, according to equation (34) using $\hat{a}$ as a(k).

The output from the power amplifier 18 is then transmitted in a conventional manner. Any well-known receiver for receiving transmitted signals may then receive and demodulate the transmitted signals. For example, the receiver may have the structure of the feedback path shown in FIG. 1.

In an alternative embodiment, the filter taps for the filters $g_{11}$, $g_{12}$, $g_{21}$, and $g_{22}$ are directly estimated using equation (18) or (24). In using equations (18) and (24), y(n) is treated as the input and x(n) is treated as the output. The resulting $h_i$, $h_q$, and d then form the basis for the I/Q compensator 12.

The invention being thus described, it will be obvious that the same may be varied in many ways. Such variations are not to be regarded as a departure from the spirit and scope of the invention, and all such modifications are intended to be included within the scope of the following claims.

We claim:

1. A transmitter, comprising:
    an upconverter for converting a first frequency signal to a second frequency signal, the second frequency signal including in-phase components and quadrature phase components;
    a compensator including a plurality of filter units for compensating at least one of gain distortion and phase distortion introduced into the second frequency signal by at least the upconverter, the plurality of filter units including a first set of filter units configured to filter the in-phase components and quadrature phase components, output of the first set of filter units producing at least one of a gain compensated in-phase signal and a phase compensated in-phase signal, and a second set of filter units configured to filter the in-phase components quadrature phase components, output of second set of filter units producing at least one of a gain compensated quadrature-phase signal and a phase compensated quadrature-phase signal;

a compensator constructor, based on a channel model of at least the upconverter that includes an in-phase channel, a quadrature phase channel and cross coupling channels between the in-phase and quadrature phase channels, estimating the in-phase channel, the quadrature phase channel, and the cross coupling channels between the in-phase and quadrature phase components, and configuring filters taps for the first and second set of filter units; and a predistorter to predistort the first frequency signal.

2. The transmitter of claim 1, wherein
the upconverter is a direct upconverter for directly upconverting a baseband signal to an RF signal; and
the compensator compensates for at least one of gain imbalance and phase imbalance introduced into the baseband signal by at least the direct upconverter.

3. The transmitter of claim 2, wherein the compensator compensates for dc offset introduced into the baseband signal by at least the direct upconverter.

4. The transmitter of claim 2, wherein the compensator constructor derives the filters as an inverse of the channel model for the direct upconverter based on the estimates and a cost function, which represents a mean squared error, in the frequency domain, between a desired response of a system including at least the direct upconverter and an actual response of the system including at least the filters and the direct upconverter.

5. The transmitter of claim 2, wherein the compensator constructor estimates each of the in-phase channel, the quadrature phase channel, and the cross coupling channels between the in-phase and quadrature phase channels based on output from the compensator and a baseband signal derived from output of the direct upconverter.

6. The transmitter of claim 5, further comprising:
a feedback path including a down converter down converting output of the direct upconverter; and wherein
the compensator constructor receives a signal on the feedback path.

7. The transmitter of claim 5, further comprising:
a power amplifier amplifying the RF signal for transmission;
a feedback path including a down converter down converting output of the power amplifier; and wherein
the compensator constructor receives a signal on the feedback path.

8. The transmitter of claim 1, wherein the compensator compensates for dc offset introduced into a lower frequency signal by at least the upconverter.

9. The transmitter of claim 1, wherein:
the first set of filter units include a first filter unit to filter the in-phase components and a second filter unit configured to filter the quadrature phase components; and
the second set of filter units include a third filter unit configured to filter the in-phase components and a fourth filter unit configured to filter the quadrature phase components.

10. The transmitter of claim 9, further comprising:
a first adder configured to add the output of the first and second filter units to produce the at least one of the gain compensated in-phase signal and the phase compensated in-phase signal; and
a second adder configured to add the output of the third and fourth filter units to produce the at least one of the gain compensated quadrature-phase signal and the phase compensated quadrature-phase signal.

11. The transmitter of claim 10, further comprising:
a third adder configured to add an in-phase DC component to the in-phase signal; and
a fourth adder configured to add a quadrature-phase DC component to the quadrature-phase signal, wherein the in-phase DC component and the quadrature-phase DC component compensates DC offset.

12. A transmitter, comprising:
a direct upconverter for converting a baseband signal directly to an RF signal, the baseband signal including in-phase and quadrature phase components;
a compensator including
a first filter for filtering the in-phase component to compensate for at least one of gain imbalance and phase imbalance in the in-phase component,
a second filter for filtering the quadrature phase component to compensate for at least one of gain imbalance and phase imbalance in the in-phase component associated with cross-coupling of the quadrature phase component with the in-phase component,
a third filter for filtering the quadrature phase component to compensate for at least one of gain imbalance and phase imbalance in the quadrature phase component, and
a fourth filter for filtering the in-phase component to compensate for at least one of gain imbalance and phase imbalance in the quadrature component associated with cross-coupling of the in-phase component with the quadrature component;
a compensator constructor, based on a channel model of at least the upconverter that includes an in-phase channel, a quadrature phase channel and cross coupling channels between the in-phase and quadrature phase channels, estimating the in-phase channel, the quadrature phase channel, and the cross coupling channels between the in-phase and quadrature phase components, and configuring filter taps for the first and second set of filter units; and
a predistorter to predistort the first frequency signal.

13. The transmitter of claim 12, further comprising:
a first adder adding output of the first and second filters;
a second adder adding output of the third and fourth filters; and wherein
the direct upconverter receives output from the first and second adders.

14. The transmitter of claim 13, further comprising:
a third adder adding a first dc offset to the in-phase component to compensate for dc offset introduced into the baseband signal by at least the direct upconverter; and
a fourth adder adding a second dc offset to the quadrature phase component to compensate for dc offset introduced into the baseband signal by at least the direct upconverter; and wherein
the direct upconverter receives output from the third and fourth adders.

15. A method of generating an RF signal, comprising:
up converting a first frequency signal to a second frequency signal, the second frequency signal including in-phase components and quadrature phase components; and
compensating using a plurality of filter units for at least one of gain and phase distortion introduced into the second frequency signal by at least the upconversion, the plurality of filter units including a first set of filter units configured to filter the in-phase components and quadrature phase components, output of the first set of filter units producing at least one of a gain compensated in-phase signal and a phase compensated in-phase signal, and a second set of filter units configured to filter the in-phase components quadrature phase components, output of second set of filter units producing at least one of a gain compensated quadrature-phase signal and a phase compensated quadrature-phase signal;

deriving, based on a channel model of at least the upconverting step that includes an in-phase channel, a quadrature phase channel and cross coupling channels between the in-phase and quadrature phase channels, estimates of the in-phase channel, the quadrature phase channel, and the cross coupling channels between the in-phase and quadrature phase components;

configuring filter taps for the first and second set of filter units; and predistorting the first frequency signal.

16. The method of claim 15, further comprising:
compensating for dc offset introduced into a lower frequency signal by at least the upconversion.

17. The method of claim 16, wherein the up converting step directly up converts a baseband signal to the RF signal.

* * * * *